(12) United States Patent
Vilella

(10) Patent No.: US 7,486,813 B2
(45) Date of Patent: *Feb. 3, 2009

(54) ELECTRONIC ASSEMBLY VIDEO INSPECTION SYSTEM

(75) Inventor: Joseph L. Vilella, San Diego, CA (US)

(73) Assignee: Easton Hunt Capital Partners, L.P., New York, NY (US)

( * ) Notice: Subject to any disclaimer, the term of this patent is extended or adjusted under 35 U.S.C. 154(b) by 43 days.

This patent is subject to a terminal disclaimer.

(21) Appl. No.: 11/586,949

(22) Filed: Oct. 25, 2006

(65) Prior Publication Data

US 2007/0047797 A1    Mar. 1, 2007

Related U.S. Application Data

(62) Division of application No. 11/398,020, filed on Apr. 4, 2006, now Pat. No. 7,366,341, and a division of application No. 10/838,960, filed on May 4, 2004, now Pat. No. 7,043,070, and a division of application No. 10/682,262, filed on Oct. 8, 2003, now abandoned, and a division of application No. 09/486,234, filed on Feb. 23, 2000, now Pat. No. 6,681,038.

(51) Int. Cl.
*G06K 9/00* (2006.01)

(52) U.S. Cl. .................................... 382/141; 382/145

(58) Field of Classification Search ................. 382/141, 382/145, 147, 148, 149, 151, 152, 312; 348/189; 345/87

See application file for complete search history.

(56) References Cited

U.S. PATENT DOCUMENTS

| 6,681,038 B2 * | 1/2004 | Vilella | 382/145 |
| 7,043,070 B2 * | 5/2006 | Vilella | 382/141 |

* cited by examiner

*Primary Examiner*—Duy M Dang
(74) *Attorney, Agent, or Firm*—Charmasson, Buchaca & Leach, LLP

(57) ABSTRACT

An apparatus for automatically assessing the quality of a printed circuit board assembly using digitized video image analysis. The apparatus integrates with existing relatively low precision automated surface mount technology ("SMT") manufacturing systems as an inspection station insertable at various steps in the assembly process or as a separate manually loaded station. The inspection station includes a high resolution video imaging system and a video image analyzer comprising an onboard master computer that generates control signals to reposition the camera mounted within a screen on a movable carriage and/or reposition the circuit board, and adjust the lighting; and generates individual board status data to be archived, graphically displayed on monitors or otherwise utilized by a rework station.

23 Claims, 6 Drawing Sheets

ELECTRONIC ASSEMBLY VIDEO INSPECTION SYSTEM

PRIOR APPLICATION

This is a divisional application of Ser. No. 11/398,020 filed Apr. 4, 2006 now U.S. Pat. No. 7,366,341 issued Apr. 29, 2008, a divisional application of Ser. No. 10/838,960 filed May 4, 2004 now U.S. Pat. No. 7,043,070 issued May 9, 2006, a divisional of Ser. No. 10/682,262 filed Oct. 8, 2003 now abandoned, a divisional of Ser. No. 09/486,234 filed Feb. 23, 2000 now U.S. Pat. No. 6,681,038 issued Jan. 20, 2004, a US entry of PCT/US98/21383 filed Oct. 8, 1998, which claims the benefit of Ser. No. 08/947,756 filed Oct. 9, 1997 now abandoned, which claims the benefit of provisional application Ser. No. 60/028,451 filed Oct. 9, 1996.

FIELD OF THE INVENTION

This invention relates to automated assembly mechanisms for electronic components, quality assurance, and more particularly to devices used in assessing whether components have been assembled adequately.

BACKGROUND OF THE INVENTION

The ever-increasing miniaturization of electronic components modules and assemblies and the market pressures for cost reduction has made the assembly of those devices a precise, automated, multi-step task. Most devices are assembled using surface mount technology ("SMT") wherein scores, if not hundreds of individual components are precisely placed and soldered on at least one printed circuit board in an "assembly line" fashion.

Printed circuit boards travel successively, in-line along conveyors through a series of stations which perform each step in the assembly process. Typically, an empty board enters a solder paste delivery system which places uncured solder paste on portions of the board requiring soldered connections. The board then enters one or more chip shooter stations which physically place components on the board. The board then proceeds through an oven which cures the solder paste. After cooling the board is ready for testing and other finalization steps prior to packaging and shipment.

At each step there is a potential for errors to occur which result in a defective board. Some of the potential printed circuit board assembly defects include: circuit board defects such as opens and shorts on the traces; placement defects wherein components are missing, of the wrong type, incorrectly oriented, or misaligned; solder defects in amount and placement which can result in solder bridges on the leads or tomb-stoning of components caused by solder contraction during curing; and other defects such as damage caused by mechanical mishandling.

Previous procedures and devices for testing whether defects exist on freshly assembled printed circuit boards suffer from various drawbacks.

Human testing and inspection is costly, slow and subject to a high degree of inaccuracy. The devices used by human testers are typically heavy, bulky, and not readily portable. Electronic in-circuit testing suffers from being slow and highly iterative in order to pinpoint the location of a defect and often cannot detect the most common manufacturing errors.

In order to minimize continued work on a board which has already become defective, manufacturers often provide for testing at several stages during assembly. However, a particular piece of automated test apparatus is usually designed to test a specific type of board, specific defects, and/or only at a specific point in the assembly. Therefore, numerous different testing devices have been required.

Current automatic visual or other electromagnetic radiation based inspection systems suffer from similar drawbacks. X-ray based systems are suited to scan for metallic defects such as faulty traces and subsurface defects. However, high resolution x-ray inspection is expensive and time consuming, and potentially hazardous to nearby human operators.

In other systems, light produced by lamps or LEDs ("Light-Emitting Diodes") is reflected off the surface being inspected into one or more video cameras. Some require the use of two images obtained under different lighting conditions as disclosed in Takahashi, U.S. Pat. No. 5,059,559. Other various digital and analog signal analyzing processes can be used to determine the existence of visually detectable defects. For example analyses have been made upon a monochrome intensity comparison measurement of the signal corresponding to the image of the gaps between terminal leads.

These systems are relatively low resolution and hence slow. If thorough inspection is required, the system must zoom in and successively scan portions of the board in a piecemeal fashion. In addition, monochrome intensity comparisons are prone to inaccuracies where adjacent features have similar intensities. An averagely populated, 3 inch by 5 inch board, such as a standard PCI SVGA video adapter card will take about 1 minute 20 seconds to inspect thoroughly.

Most prior systems require extremely precise location of the board and camera, on the order of 0.001 of an inch. The board and camera must be made resistant to vibration. The prior solution entailed a massive platform made of slate or other heavy materials, and precise, vibration-resistant board handling and camera carriage mechanisms. Most prior systems weighed greater than 450 kilograms. These requirements increase the cost and lower the portability of the system.

Therefore, it is desirable to have an economical, automated testing system, which quickly detects the existence of the most prevalent manufacturing defects, which determines automatically whether a particular board may benefit from reworking and efficiently informs the rework station of those defects; which keeps track of defects over time to identify problems symptomatic to the assembly system; and which is quickly and easily moved to different points in the assembly line or out of the assembly line altogether for manual testing.

The instant invention results from an attempt to reduce cost, and to improve the throughput and efficiency of automated assembly systems.

SUMMARY OF THE INVENTION

The objects of this invention are: to improve defect detection in the inspection and testing of electronic components assemblies; to more efficiently direct repair; to allow for the monitoring over time of the quality of inspected boards, in order to improve the throughput of automatic assembly mechanisms; to allow portability of the inspection device to various points on the assembly line and off the assembly line altogether for manual testing.

These and other valuable objects are achieved by an automated, high-resolution, digital image inspection system, installed in a portable low-precision SMT type dispensing station. The system identifies the printed circuit board being inspected, and locates visually detectable defects thereon. The type and location of defects are automatically associated with the board in a database, which is accessible by a rework/ repair station, and which allows for statistical monitoring of the history and status of an assembly's product.

DESCRIPTION OF THE PREFERRED EMBODIMENT OF THE INVENTION

Figure 1:
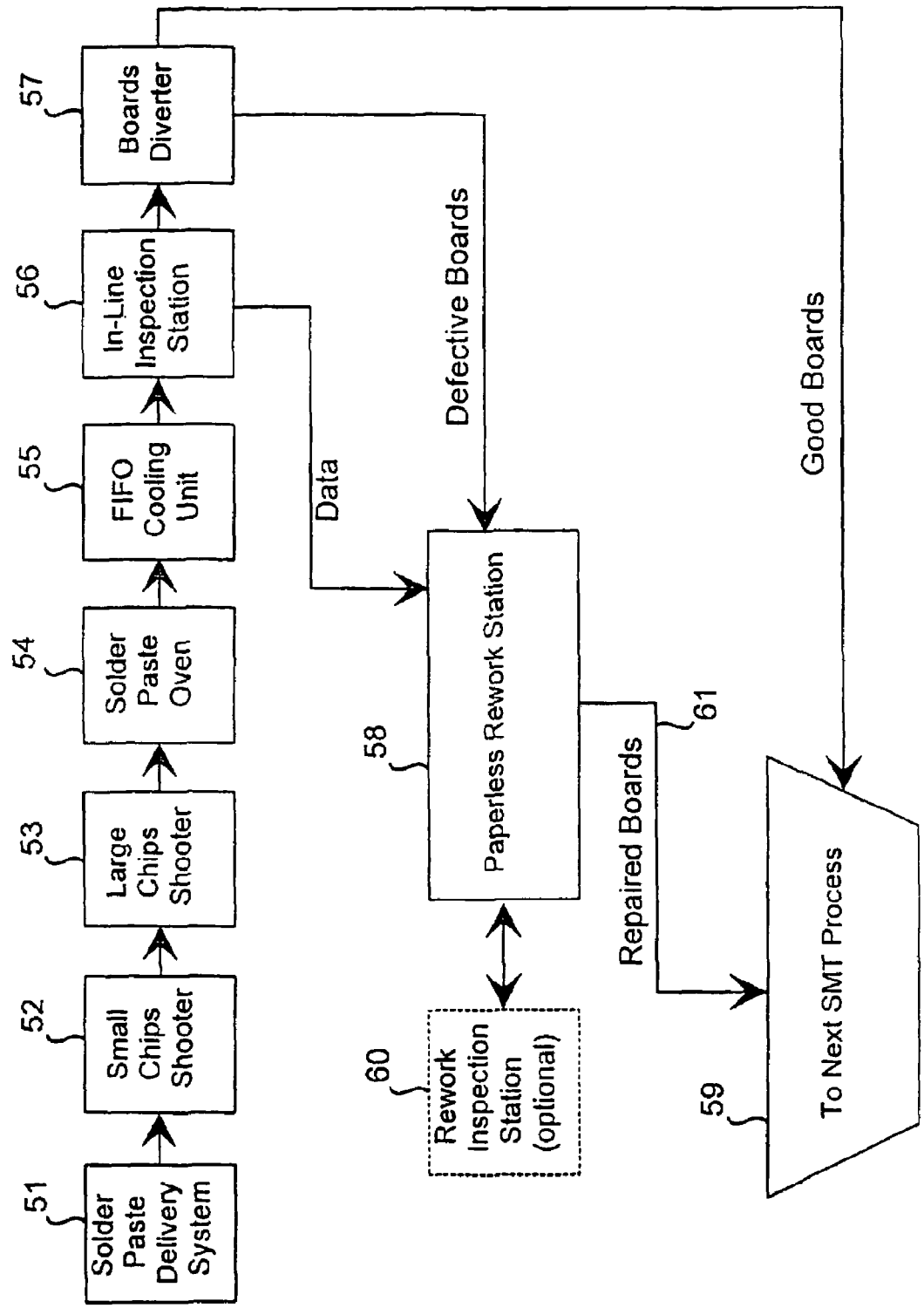
FIG. 1 is a process flow block diagram of the populated board inspection system as integrated in a surface mount technology assembly line.

Referring now to the drawing, there is shown in FIG. 1 a functional block diagram of a typical SMT assembly line where printed circuit boards are assembled in a series of processing stations. Circuit boards move from solder paste application station 51, to one or more chip shooter stations 52, 53 and to an oven 54 for curing. An optional first-in-first-out ("FIFO") buffer station 55 may be used to connect stations which complete their tasks more sporadically, or in different groupings of boards. In the present embodiment the FIFO station 55 is used as a cooling station for groups of boards exiting the curing oven 54 before entering the inspection station 56.

It should be noted that the inspection station 56 may be located between any one of the stations of the assembly process or as a stand alone manually loaded station. However, the preferred location is immediately after the boards have become fully populated, so as to prevent any further processing of defective boards.

In its most automated embodiment, the inspection station 56 will be followed by a board diverter 57 station which, according to the results provided by the inspection station, will direct defective boards to a rework station 58, and good boards to the next SMT processing station 59. The rework station has access to results provided by the inspection station. Optionally, the rework station may employ an additional inspection station 60 for inspecting reworked boards. Repaired boards will re-enter the SMT processing at this point 61 as well.

The preferred inspection station is fully compatible with the inter-station communication protocol established by the Surface Mount Equipment Manufacturer's Association ("SMEMA"), which allows for simple communication of board transport statuses to adjacent stations.

Figure 2:
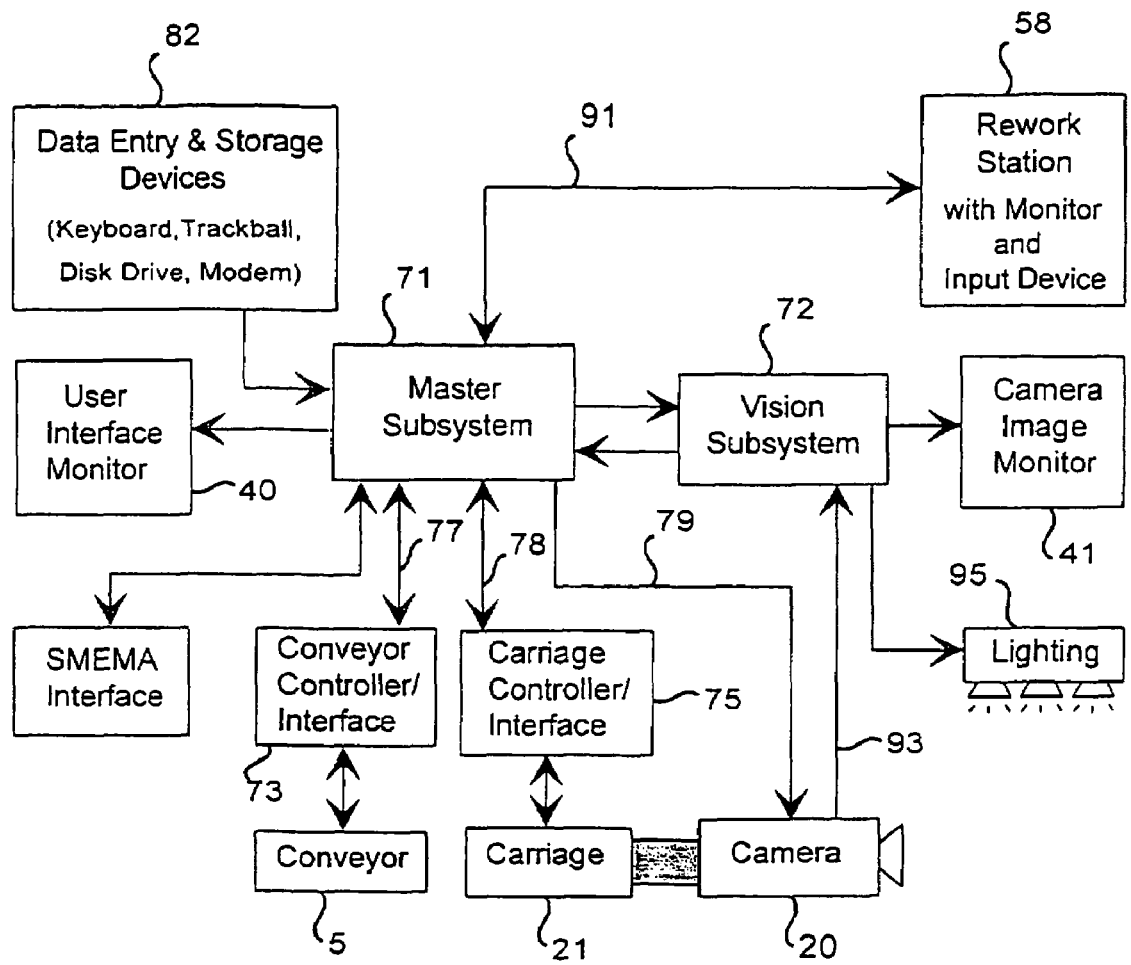
FIG. 2 is a data flow block diagram of the inspection system according to the invention.

Referring now to FIG. 2, the preferred board inspection system is arranged in several functional units and subsystems. Automatic control is handled by a master subsystem 71 as directed by a vision subsystem 72. During automated "in-line" operation, the master subsystem generates commands to the conveyor controller/interface 73 for activating board handling mechanisms, including a conveyor 5, and to the carriage controller/interface 75 for moving the carriage mounted camera 20, via data communication lines 77, 78. A separate data line 79 carries zoom commands to the camera 20. The master subsystem also carries out other tasks such as the archiving and flow of data to and from the vision subsystem 72 and data entry and storage devices 82 and to the user interface monitor 40. Another data line 91 communicates rework data to and from the rework station 58 and its control monitor. Data lines preferably conform to RS-232 or other well known digital data communications standards.

In this preferred embodiment of the invention, the camera 20 will output a digital pulse train signal 93 comprising the encoded current video image to the vision subsystem 72. Alternatively, the camera 20 may issue a video signal which is converted to a digital signal by a digitizer integrated or peripheral with the vision subsystem 72.

The vision subsystem 72 comprises a microprocessor controlled digital signal analyzer. Its primary function involves analyzing image data received via a data line 93 from the camera 20 in order to detect board defects. Part of this function involves signaling the master system 71 to generate control commands for accepting and ejecting boards, driving the carriage in order to position the camera 20, and issuing camera zoom commands. Configuration of the vision subsystem occurs through user data entry and storage devices 82 directly or via the master subsystem 71. The vision subsystem 72 also directs the current image received from the camera to the image display monitor 41. The vision subsystem 72 handles adjustment of the lighting 95 in the inspection cavity as well.

The resolution and zoom capabilities of the camera must be selected according to the size, density and appearance of the defects being inspected. A full color camera having a resolution of at least 2000×2000 pixels is preferred to discriminate features both by light intensity and wave length, allowing identification of markings on color coded components. However, where defects are discernible in monochrome, and extremely fast inspection is required, a digital black and white camera may be used. While an analog signal camera may be employed, a digital camera is preferred for both speed and accuracy.

Defects are discovered using digital image analysis techniques well-known in the art such as by testing the scanned images against a table of expected or otherwise acceptable values for certain features, such as space between terminal leads. Preferably, testing involves a numerical, rule based analysis of the images. The type and location of any defect is then added to the database record for the current board being inspected. A decision is also made regarding whether the detected defects are severe enough to require rework of the board.

The best mode vision subsystem uses the OMEGATEK 2000 brand digital image analyzing model developed by Omegatek, Inc. of San Diego, Calif. which includes a full color digital camera having resolution of 2000×2000 or 4 million pixels and a fixed or auto zoom lens. This particular type of image analyzing model is based on a 200 MHz PENTIUM brand microprocessor and uses proprietary image processing algorithms.

Using a camera having a resolution of at least 4 million pixels, features as small as approximately 12.5 microns (0.5 mils) have been adequately discriminated. Using the OMEGATEK 2000, an averagely populated 3 inch×5 inch board such as standard PCI SVGA video adapter card will take about 20 to 30 seconds to inspect thoroughly. Inspection speed can be further increased by adding more and faster processors to either or both systems.

While similar systems can tolerate imprecision of the camera carriage of 0.001 of an inch, the invention can accommodate imprecision of 0.02 of an inch. Additionally, the carriage does not have to be as precise or fast as similar systems, thus a less expensive mechanism may be employed. Additionally, it is not necessary to put down stabilizing supports.

As a result of the high resolution to the vision subsystem, typical inspections can be done using a single image from a single scanned camera frame. However, if finer detail is required the camera can "zoom-in" and the inspection can be done using multiple images. The distance between the camera and the board typically ranges from 5 to 10 inches, as limited only by the enclosure size with the average distance at 7.2 inches. Although the usual height of components is 0.5 to 0.75 inches, unusually tall components such as those 2 inches high, can be accommodated, making reconfiguration of the vision subsystem unnecessary.

Being tolerant of much lower precision movement and placement translates directly into a system that is lighter weight and less expensive. Being more portable, the station can easily be moved to different locations in the assembly line, moved out of the line as a manual inspection or rework station, or off-site.

Figure 3:
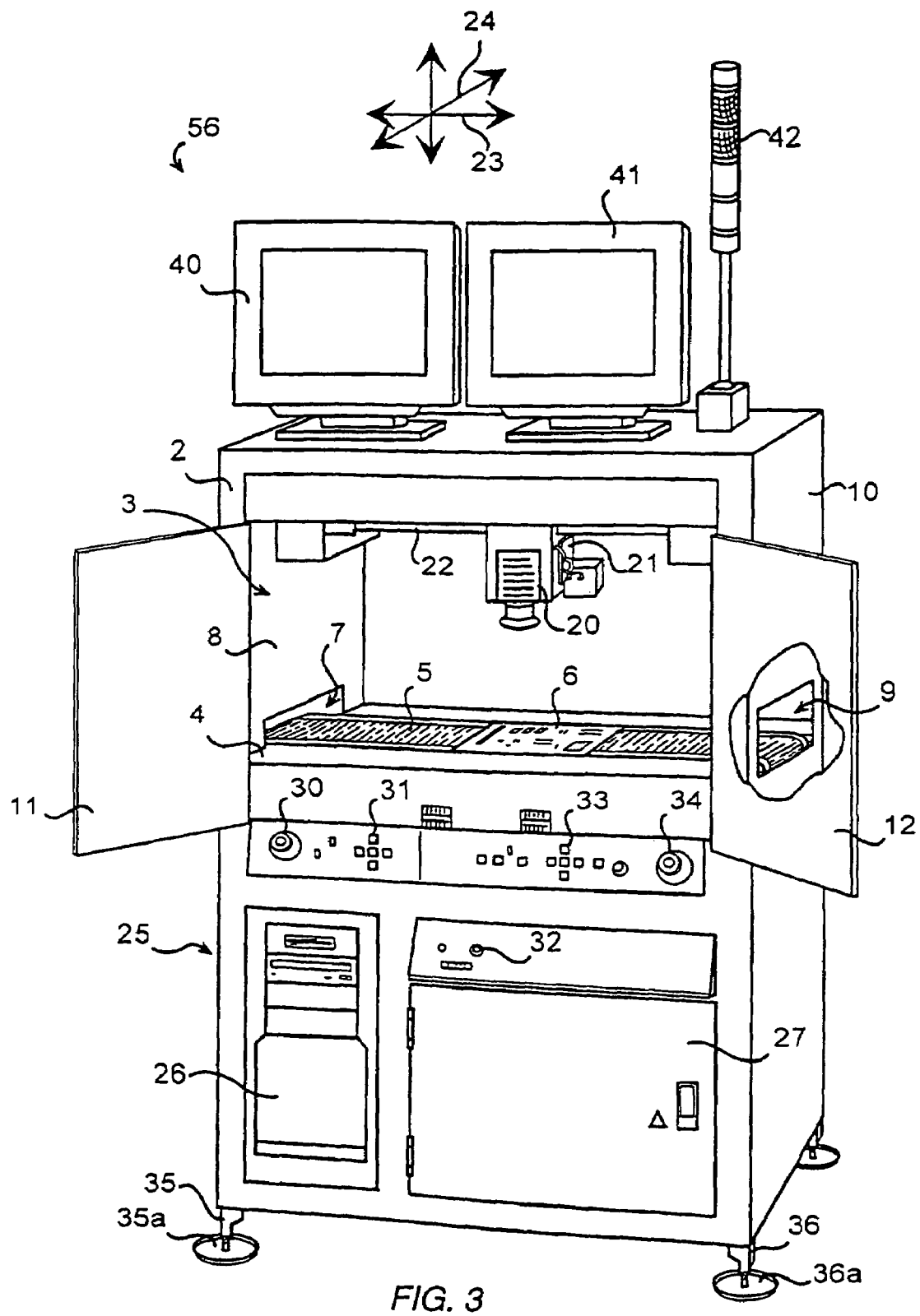
FIG. 3 is a diagrammatic perspective view of a first embodiment of the inspection station of the invention having a board handling conveyor.

Referring now to FIG. 3, there is shown the automated embodiment an electronic assembly video inspection station 56. The physical layout of the automated station is governed by its compatibility with standard SMT automated assembly processes. The station comprises a housing 2 having an inner inspection cavity 3 with a lower surface 4 upon which traverses a board handling and transport mechanism, including a conveyor 5 for carrying a circuit board 6 to be inspected.

The conveyor 5 receives the board 6 through an aperture 7 in a side wall 8, then positions it under the camera 20. After inspection, the board 6 continues along the conveyor 5 toward another aperture 9 in an opposite wall 10 through which the board is ejected. The inspection cavity is accessible for maintenance through a pair of access doors 11,12. During manual operation individual boards may be loaded for inspection through these doors, or through a precision alignment drawer described below.

The video camera 20 is mounted to a movable, motorized carriage 21 attached via a track 22 to the ceiling of the cavity 3. The carriage allows for directed width 23 and depth 24 movements of the camera in a plane substantially parallel to the plane of the board 6 being inspected. This allows for the station to inspect boards of varying sizes and complexities.

The carriage is preferably moved via servo motors such as a pair of stepping motors powered with a pulsing signal generated by the carriage controller that induces incremental rotational movement of each motor. Each motor in turn drives the carriage along a pair of orthogonally oriented precision linear slides. The first slide is mounted to the enclosure and the second to a portion of the carriage.

Below the inspection cavity 3 is a cabinet 25 housing the master subsystem computer 26 and an electronics bay 27 housing components of the vision subsystem and the various controllers and interfaces necessary for signaling the components of the station, such as the conveyor and carriage controllers. Manual controls such as a power switch 30, conveyor overrides 31, conveyor pneumatic pressure controls 32, carriage overrides 33, and an emergency shut-down switch 34, as well as various status indicators extend from a front panel of the cabinet. Height adjustable legs 35, 36 allow for vertical positioning and orientation of the station housing 2. While the end of the legs may terminate in foot pads 35a, 36a, locking wheels 35b, 36b are preferable as shown in the manual inspection station embodiment of FIG. 4.

Atop the station housing 2 are a pair of monitor displays 40, 41 providing user interface screens to the analysis and control system, and images recorded by the camera. An overall station status light tree 42 is also provided.

The inspection station 56 is preferably adapted from an existing SMT dispensing station such as the Model No. A-618C and sold commercially from Asymtek, Inc., of Carlsbad, Calif. Using this relatively low precision system, the entire inspection station weighs under 250 kilograms. This dispenser provides most of the major components described above in an integrated package. A detailed description of the dispenser is available in the A-612/618C System Operations Manual available from Asymtek, which is incorporated herein by this reference.

In general the A-618C provides the housing and board handling mechanisms including a pneumatically driven conveyor and its controller and interfaces, the carriage and its controller and interfaces, and the necessary SMEMA controllers and interconnections. The dispenser is adapted by replacing its fluid injection equipment. There is no need to replace the existing low precision carriage 21, since the high resolution vision subsystem can tolerate it. The height of the carriage 21 may be adjusted to allow proper focal distance between the camera 20 and the board 6. The main computer of the dispenser assumes the tasks of the master subsystem of the inspection station. Standard monitors are preferably replaced with Super Video Graphics Array ("SVGA") type monitors for user interface 40 and monitoring camera image 41.

The A-618C provides for translation of the carriage over a range which will accommodate boards of approximately 46×46 centimeters (18×18 inches).

Even in the most automated system, human intervention is often required to maintain the proper alignment of integrated mechanical components and to monitor the station's progress. Therefore, an operator can observe the image being viewed on the image monitor 41, and query the status of the inspection using the interface monitor 40 and data entry devices 82. If necessary, manual operation of the inspection station is available through manipulation of manual controls 30-34.

Board inspection is a multi-step process. First, the vision subsystem is configured according to the type of board to be inspected. Parameters relating to the type, location, and orientation of each component to be inspected on the board are loaded into the vision subsystem via user data entry. Preferably, the information is available via CAD (Computer Aided Design) files or other well known formats. Previous configurations are stored on the master subsystem for quick retrieval from subsequent scans of the same board type.

Although a given run of an SMT process is typically configured for a single type of board, it should be noted that the inspection system need not be configured for only one type of board on any given run. So long as the system is able to identify each board being inspected, a large number of different typed boards may be successively inspected. This is of particular value in the optional rework inspection station 60 where many successively different boards types may require inspection. Indeed, the rework station may be serving a plurality of SMT lines.

Once the system has been configured for a particular type of board, the inspection process may begin. A circuit board 6 is positioned, face-up, on the conveyor 5 at a so-called "zero-position". The conveyor 5 moves the board 6 to a beginning position under the camera 20. Since the vision system is able to calculate its position from the visible features on the board, highly precise movement of the conveyor and carriage is unnecessary. The inspection can take place with the board 6 remaining on the conveyor 5, eliminating the need for any kind of locking cradle and any board handling mechanisms required to place the board on or remove board from the cradle, further reducing cost and weight, and increasing portability and speed of inspection. However, board locking cradles may be used.

The vision subsystem first identifies the board by reading a barcode or other visible board identifying cue on the board's surface such as a bar code. The vision subsystem capable of identifying and isolating the bar code and ascertaining its identification of the board. Hence, separate bar code reading equipment is not necessary. A record relating to the board is retrieved by the master subsystem 26 for recording information about the board generated by the vision subsystem and any system reconfiguration is automatically done by the master subsystem, without user interface. If a record does not exist, the master subsystem will query the operator for descriptive input as described above.

The vision system performs a scan of the board to obtain an image for analysis. The scan may be administered first with a relatively coarse resolution followed by one or more subsequent scans in finer detail to resolve the status of questionable regions discovered during the coarse scan. Preferably, a single frame from the camera is used to increase throughput.

After inspection is complete, the board is ejected for routing to the next SMT station or to the rework station. When rework is necessary, all pertinent information for the rework is automatically available to the rework system. At the rework station a user enters or scans the board identification via a bar code reader or other input device. Data pertaining to that particular board is then retrieved from the database and graphically displayed on the rework monitor. The graphical display preferably comprises a stock image of the type of board being reworked. A stock image is used to reduce the amount of data to be sent to the rework station. Overlaid on the image, at the instruction of the rework operator, are visual icons, analogous to red dots on a map showing the location and type of defects for that board. A CAD overlay, and any other pertinent information that has been entered in the database and may also be overlaid or otherwise displayed. Alternately, a simple textual printout of defects can be made available to the rework station.

Figure 4:
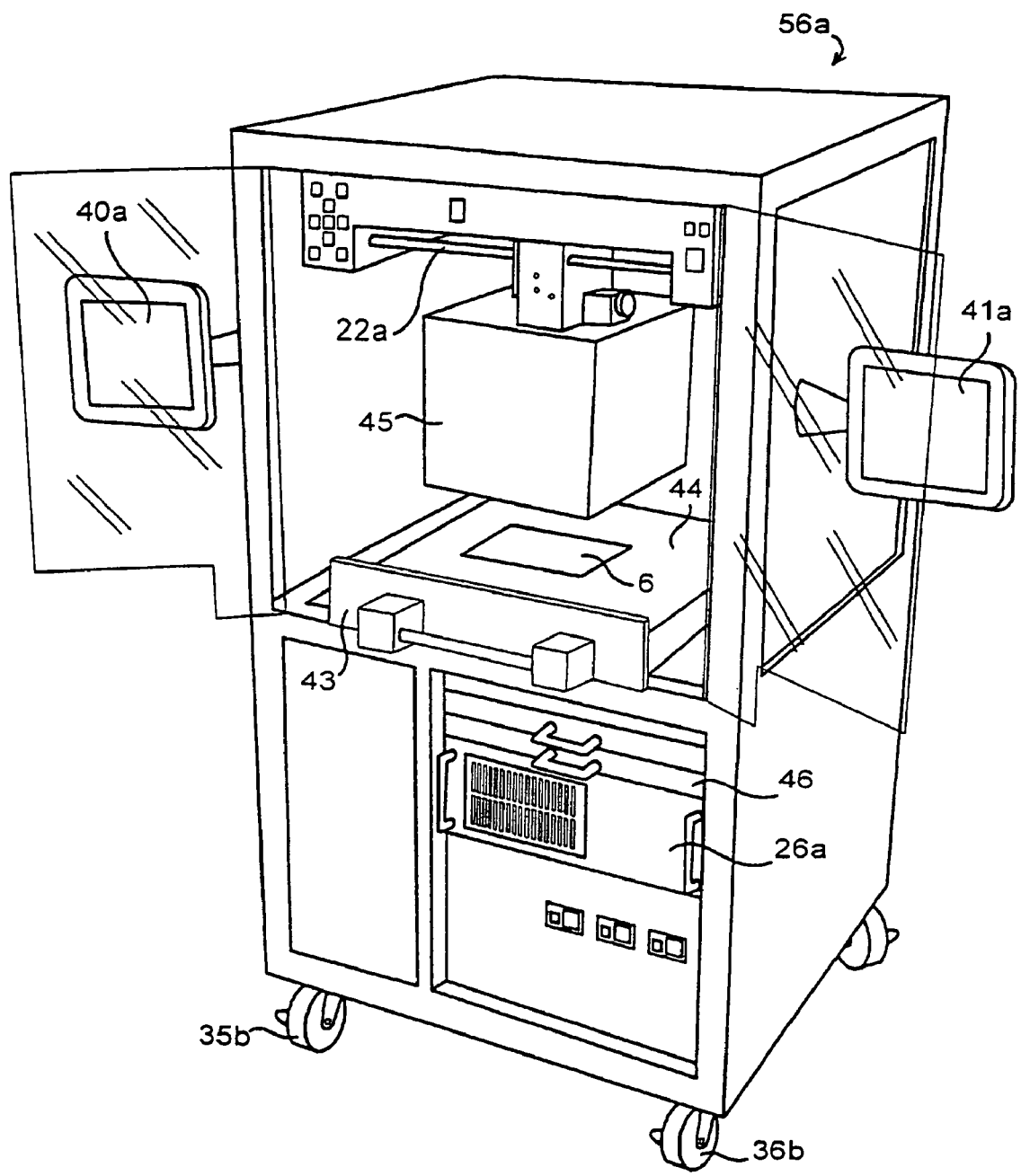
FIG. 4 is a diagrammatic perspective view of an alternate embodiment of the inspection station of the invention having a drawer for manually loading boards.
Figure 5:
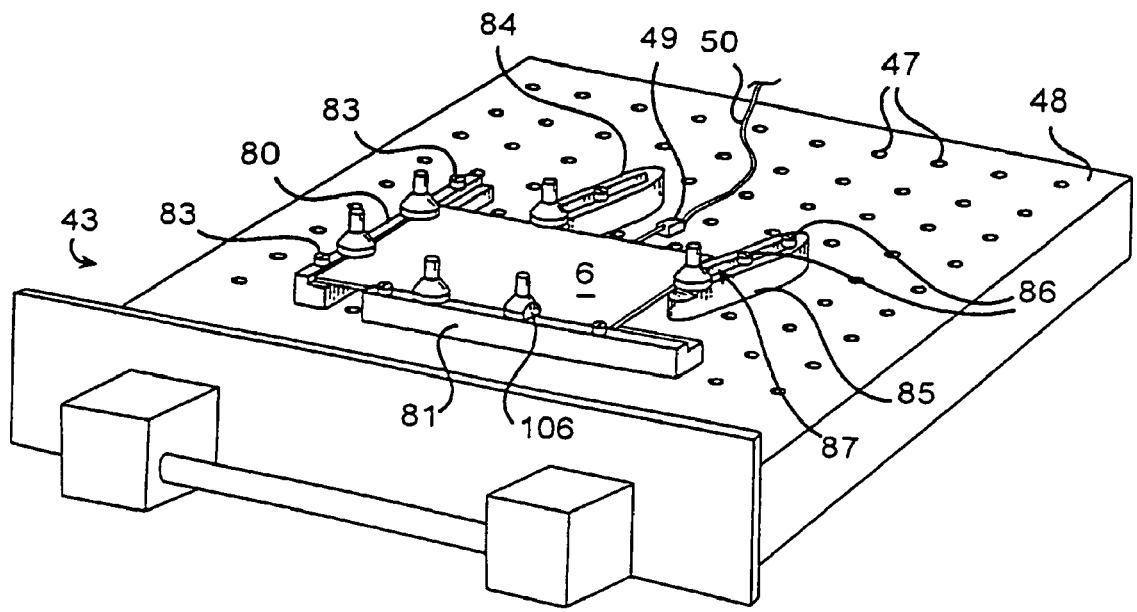
FIG. 5 is a perspective view of the manual board positioning mechanism on the drawer.

Referring now to FIG. 4, when operated as a manual inspection station for "batch processing", a drawer 43, is available to manually insert a board for inspection. The drawer 43 is located in the front of the station 56a and slides out toward the user. In this embodiment, the station 56a is not part of a SMEMA line; therefore, the light tree 42 is unneeded. In addition, both the camera and lights are mounted on the carriage 22a behind a box-like screen 45. The monitors 40a, 41a, master computer 26a, and the various switches and indicators have been relocated. A keyboard is mounted within a second drawer 46.

Referring now to FIGS. 5-8, the drawer 43 is comprised of a flat surface 48 with a plurality of die holes 47 drilled through at regular intervals both horizontally and vertically. The surface on which the board is placed is approximately parallel to the plane in which the camera travels. A switch 49 with its data line 50 is located on the holed surface 48, which detects the presence of a board 6.

Able to be affixed to the holed surface 48 are two types of attachments which secure the board in place. The first type are simple elongated piers 80, 81 through which finger tightened screws 83 engaged the holed surface. Typically, for rectangular circuit boards, these piers would be placed at right angles to one another to engage adjacent sides of the board.

The second type of attachment 84, 85 are adjustable brackets which engage the other sides of the board. Each bracket is attached to the holed surface by a pair of finger tightened screws 86 passing through an oblong slot 87. When the screws are partially tightened, the bracket can slide back and forth in a line along the holed surface.

Figure 6:
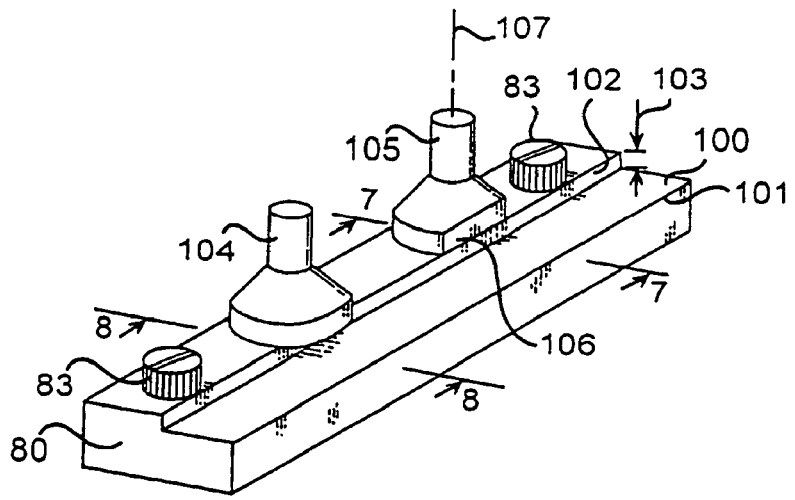
FIG. 6 is a perspective view of a board securing oblong pier.

Referring now to FIG. 6, each oblong pier 80 is made from strong, rigid material such as aluminum. The top of each pier has a horizontal planar upper surface 100 extending from the top inner edge 101 outward to a vertical planar wall 102 running longitudinally along a median portion of the top of the pier. The height 103 of the wall is roughly commensurate with the thickness of the circuit board 6 in order to adequately secure it. More outwardly located are one or more clamping knobs 104, 105 rotatively mounted to the top of the pier. Each adjustable bracket 84, 85 has a similar board securing upper surface and one clamping knob.

Figure 7:
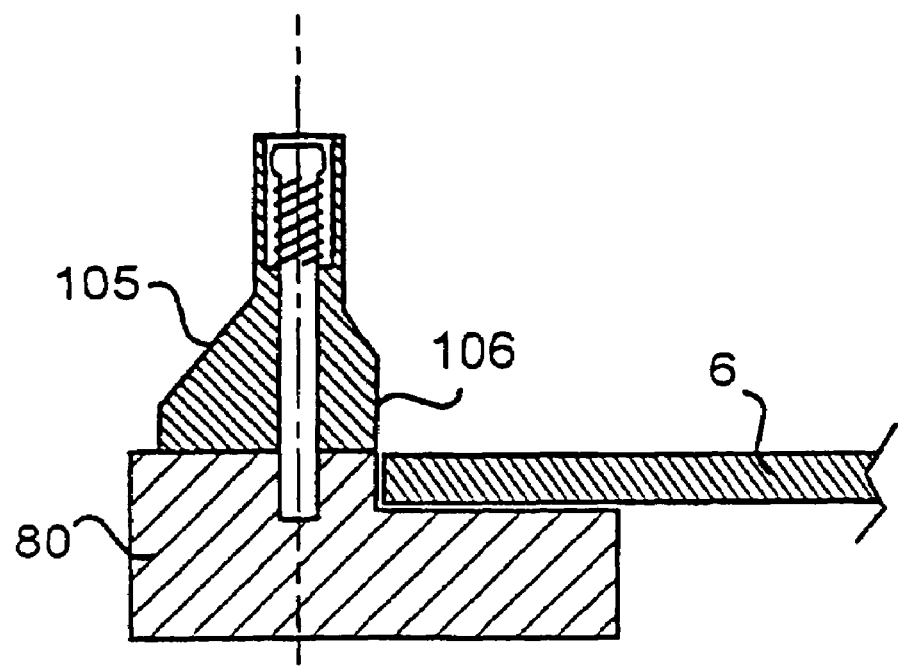
FIG. 7 is a cross-sectional view thereof with in-situ circuit board taken along line 7-7.
Figure 8:
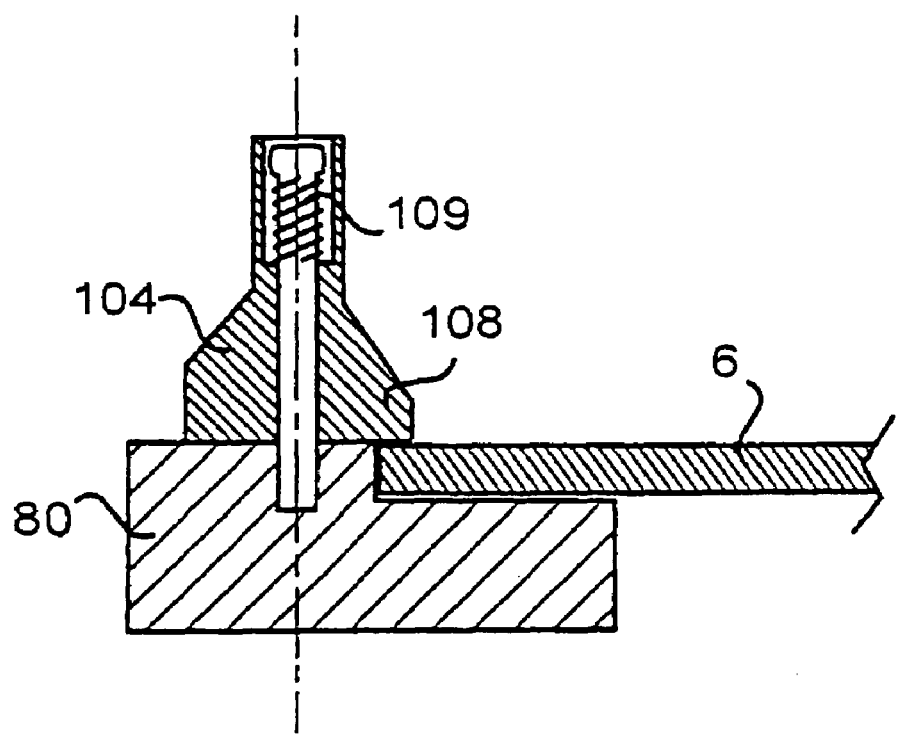
FIG. 8 is a cross-sectional view thereof with in-situ circuit board taken along line 8-8.

Each knob is generally cylindrical shaped having a vertically planar cutaway 106 placed a radial distance from the axis of rotation 107 no greater than the distance from the axis to the wall 102. This allows for extraction of the board when the cutaway is brought into alignment with the wall as shown in FIG. 7. When out of alignment as shown in FIG. 8, a portion 108 of the bottom surface of the knob extends over and contacts a portion of the top surface of the seated board 6.

Means for maintaining the position of the knobs may be used such as biasing the knob downward through use of a spring 109. Other well-known means may also be used.

Although the instant invention is directed toward the inspection of electronic assemblies such as printed circuit boards having surface mounted components, it is appreciated that the invention applies to other manufactured items having defects which are detectable through visual inspection.

Although in the preferred embodiment describes the camera being movable in a plane, it is appreciated that more complex motion involving vertical movement, and pitch, yaw, and roll movements may be added to the system depending on the type of article being inspected.

While the preferred embodiments of the invention have been described, modifications can be made and other embodiments may be devised without departing from the spirit of the invention and the scope of the appended claims.

What is claimed is:

1. A method for automatically inspecting an assembly of a variety of components, said method comprises:
   selecting a digital camera;
   obtaining via said camera, an image of a variety of components on at least one region of said assembly;
   scanning said image to obtain a record of observed features of said variety of components;
   maintaining a database of a plurality of parameters of said features; and,
   numerically analyzing each of said observed features against said parameters of said features to locate defects therein.

2. The method of claim 1, which further comprises generating an informational display of said defects.

3. The method of claim 2, wherein said informational display comprises graphical information.

4. The method of claim 2, wherein said informational display comprises textual information.

5. The method of claim 1, wherein said analyzing comprises using a numerical rule-based color image analysis algorithm.

6. The method of claim 1, wherein said numerically analyzing comprises:

comparing said image against a record of acceptable values; and identifying areas of said image which do not fall within said values.

7. The method of claim 1, wherein said maintaining comprises:

entering assembly layouts including component type, locations and orientations into said database.

8. The method of claim 7, wherein said entering comprises interpreting a computer-aided design file describing said region.

9. The method of claim 8, which further comprises:

identifying said assembly via a visual cue on a surface of said assembly read by said camera; and categorizing said assembly within one of a plurality of assembly types.

10. The method of claim 9, wherein said step of obtaining comprises:

journaling said assembly along a conveyer; and securing said assembly within view of said camera, wherein said securing has an acceptable tolerance coarser than two hundredths of an inch.

11. The method of claim 1, wherein said obtaining comprises:

scanning a first coarse resolution image of said region;

identifying a potential defect in said region using said first coarse resolution image; and scanning a first fine resolution image of said region containing said defect.

12. The method of claim 1, which further comprises cataloging a list of said defects.

13. The method of claim 2, wherein said step of generating comprises:

displaying a template representing said region;

displaying a distinct static visual icon for each of said defects at a location on said template corresponding to the location of each of said defects on said region.

14. The method of claim 13, wherein said visual icon comprises indication of a type of defect.

15. The method of claim 1, wherein said camera is mounted in an enclosure supported by wheels.

16. The method of claim 1, wherein said obtaining comprises positioning said camera a distance of at least 12.7 centimeters above said region.

17. The method of claim 1, wherein said camera is a color digitizing camera of at least 4 million pixel resolution.

18. The method of claim 1, wherein said camera is selected from the group consisting of color cameras and monochrome cameras.

19. The method of claim 1, wherein said components comprise surface mounted components.

20. The method of claim 1, which further comprises obtaining multiple images of said assembly.

21. The method of claim 1, wherein said plurality of parameters are selected from the group consisting of component type parameters, location parameters, orientation parameters and terminal lead spacing parameters.

22. The method of claim 1, wherein said inspecting is done using a single image from a single scanned camera frame.

23. The method of claim 1, wherein said obtaining comprises moving said camera.

* * * * *